(12) United States Patent
Takahashi

(10) Patent No.: US 6,800,183 B2
(45) Date of Patent: Oct. 5, 2004

(54) SPUTTERING DEVICE

(75) Inventor: Nobuyuki Takahashi, Kanagawa (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 10/280,035

(22) Filed: Oct. 25, 2002

(65) Prior Publication Data

US 2003/0085122 A1 May 8, 2003

(30) Foreign Application Priority Data

Nov. 5, 2001 (JP) ........................................ 2001-339827

(51) Int. Cl.[7] .............................................. C23C 14/34
(52) U.S. Cl. ............................. 204/298.28; 204/298.06; 204/298.26; 204/298.29
(58) Field of Search ....................... 204/298.06, 298.11, 204/298.26, 298.28, 298.23, 298.29

(56) References Cited

U.S. PATENT DOCUMENTS 5,108,574 A * 4/1992 Kirs et al. ............. 204/298.22
6,224,718 B1 * 5/2001 Meyer .................... 204/192.12
6,488,824 B1 * 12/2002 Hollars et al. .......... 204/192.22

FOREIGN PATENT DOCUMENTS

| JP | 02173260 | 7/1990 | ........... C23C/14/34 |
| JP | 06122971 | 5/1994 | ........... C23C/14/34 |
| JP | 2002088470 | 3/2002 | ........... C23C/14/34 |

* cited by examiner

*Primary Examiner*—Steven VerSteeg
(74) *Attorney, Agent, or Firm*—Venable; James R. Burdett

(57) ABSTRACT

The invention is intended to provide a sputtering device in which a single sputtering chamber is equipped with a plurality of supports and a target-positioning mechanism for rotating the supports to position the targets into film-forming position. Each support is provided with targets that are different from each other. The same types of targets are mounted in the same order on each support. The supports are rotated to select the same types of targets needed to form a film and to position the targets relative to the substrate. A plurality of the same type of targets are used simultaneously to form a film. The supports are then rotated to select the next targets, and the next film is built up on the previous film. As the film is formed, targets that are not used in the film-forming process can be cleaned with a cleaning device.

35 Claims, 7 Drawing Sheets

SPUTTERING DEVICE

BACKGROUND OF THE INVENTION

1. Field of the Invention

The present invention relates to a sputtering device, and in particular to a sputtering device which allows a film to be formed on a substrate by means of the simultaneous sputtering of a plurality of targets, so as to economize on space and achieve a higher throughput.

2. Description of Related Art

In the usual conventional sputtering device, a film is formed on a substrate by means of the sputtering of a target of a size allowing a film to be formed on the surface of a substrate where the intended film is to be formed.

FIG. 1, which is a schematic for illustrating the primary components in the sputtering process chamber (referred to as the sputtering chamber) of such a conventional sputtering device, is a plan that is viewed from above parallel to the substrate surface. 100 is a tray, 102 is a gate valve, and 104 are substrates mounted on the tray. As is well known, the substrates 104 are fed in and out in the direction indicated by arrow a through the gate valve 102 into the sputtering chamber.

110 are cathodes with cathode mounting surfaces parallel to the substrate surface, and 112 are targets mounted on the cathode mounting surfaces.

The targets 112 are usually of a size greater than the size of the substrate. In a conventional sputtering chamber, the film is formed with the target disposed in a position suitable for forming the film, one target per substrate. Accordingly, in cases where films are sequentially built up on a substrate using different types of targets, dedicated sputtering chambers of the same type as the type of target are prepared, and the films are formed in sequence in the various different sputtering chambers.

Thus, in conventional sputtering devices, a dedicated sputtering chamber is required for each different type of target, unavoidably resulting in a device of large size, and the need for moving the substrate in and out of each sputtering chamber and other related operations result in a lower throughput.

Furthermore, in conventional devices, increases in the substrate size are accompanied by increases in the size of the target, making it difficult to form a film of uniform thickness on surfaces of large area where the film is to be formed. It is thus difficult to achieve the film thickness distribution standards required of film-forming devices when using conventional sputtering devices.

Japanese Examined Patent Application (Kokoku) 8-26453 discloses a sputtering device in which a plurality of targets are provided to form an alloy thin film. In this sputtering device, three cathodes are provided in one sputtering chamber, where one target of a certain type is attached to the center cathode, and the targets attached to the remaining two cathodes are different from the center target but are the same as each other. In this conventional example, it is disclosed that the center target is disposed parallel to the surface of the substrate on which the film is formed, that the two flanking targets are disposed at an incline, and that the distance between the targets and the surface on which the film is to be formed, as well as the incline of the two flanking targets, can be adjusted.

However, because the device disclosed in Japanese Examined Patent Application (Kokoku) 8-26453 is a device for forming a single alloy film with a composition consisting of the target components, that is, the alloy components, it is necessary to move the substrate in and out of separate sputtering chambers to form different types of films continuously on the alloy film. Naturally, the problems of economizing on space and achieving a higher throughput described in the present application are therefore not solved by this device.

Japanese Unexamined Patent Application (Kokai) 6-122971 discloses a sputtering device in which a plurality of targets is provided to form a film consisting of a plurality of constituent elements. In this sputtering device, a plurality of targets are sequentially passed through sputtering positions, and each time a film component is formed, it is formed while a target is facing the substrate.

However, since even the device disclosed in Japanese Unexamined Patent Application (Kokai) 6-122971 is a structure in which the substrate and target are aligned in a one-to-one relation when the film is formed, the aforementioned problems naturally remain unsolved.

SUMMARY OF THE INVENTION

An object of the present invention is thus to provide a sputtering device which allows a film to be formed on a substrate by means of the simultaneous sputtering of a plurality of targets, so as to economize on space and achieve a higher throughput.

To achieve this object, the sputtering device of the present invention comprises the following structural features.

That is, the sputtering device comprises a sputtering chamber, a plurality of target supports, cathodes, and a target-positioning mechanism.

The plurality of supports are provided apart from each other in the sputtering chamber. The supports are provided in such a way that the target-mounting surfaces are aligned facing the film-forming surface of the substrate mounted on a substrate holder or tray. Each of the supports is also constructed in such a way as to be able to rotate (or turn) around the center axis.

Each support is provided with cathodes. The plurality of cathodes provided on a support are provided apart from each other, each cathode having a plurality of target-mounting surfaces.

The target-positioning mechanism is able to rotate the supports having targets mounted on their target-mounting surfaces, so as to position one of the plurality of targets on each support into film-forming position where the target faces the surface where the film is to be formed.

Thus, in the structure of the sputtering device of the invention, the supports are provide facing the surface of the substrate on which the film is to be formed. The supports are provided with an equal number of a plurality of cathodes. Targets that are different from each other can be mounted on the target-mounting surfaces of the plurality of cathodes per support. When a plurality of kinds of targets are mounted on each support, the same number of kinds, preferably in the same order, are provided.

Because targets of the same type can thus be mounted on each support, the same kinds of targets, which are divided across several small targets, can be mounted instead of using a single large-sized target, so as to form a film of more uniform thickness on a substrate shared in common. Particularly when the substrate is a glass substrate, the greater the size of the glass substrate the more beneficial it is, in the interests of making a more uniform film thickness, to produce a film with a plurality of targets with a surface area equal to a small-sized glass substrate.

Because the structure of the present invention also permits a plurality of targets to be provided per support, as described above, the targets can be arranged in such a way that the types of targets provided on each support are the same, so that the supports can be rotated by the target-positioning mechanism to select and position targets in order to produce a film with different components. It is thus possible to continuously produce a film with two or more different components on the same substrate in the same sputtering chamber. Thus, even though it was conventionally necessary to provide a sputtering chamber for each type of target, in the present invention it is possible to use a single sputtering chamber, that is, film-forming chamber, to form a plurality of films using different targets.

Thus, because there is no need for moving the substrate in and out of different sputtering chambers for each component of a film or other related operations, the device of the invention results in smaller space and higher throughput than in conventional devices.

Because targets of a small size are used, not targets of a large size, the unit cost of the targets is less expensive, resulting in lower overall costs.

Furthermore, because the supports themselves in the sputtering device of the present invention are constructed in the form of rotatable supports, the targets can be pre-cleaned as desired on the surfaces of the targets, which are the surfaces not facing the substrate, making it possible to smooth areas which are not erosion regions, eliminate splats, and eliminate nitride films formed on target surfaces in the case of Ti targets, for example.

When working the invention, the center target-mounting surface facing the center of the surface on which the film is to be formed should be parallel to that surface. Even more preferably, the peripheral target-mounting surfaces on the periphery of the surface on which the film is to be formed should be inclined relative to the center target-mounting surface in such a way that the sides which are further away from the center target-mounting surface are closer to the surface on which the film is formed.

The angle of incline of the center and peripheral target surfaces relative to the surface on which the film is formed can thus be varied to allow a film of more uniform thickness to be formed.

When rotating the supports themselves to position the peripheral targets, the angle of rotation can be selected to adjust the angle of incline (also called inclination) of the target-mounting surface relative to the surface on which the film is formed, and thus of the target surface. Because the film-forming conditions are different in the initial stages of sputtering than at the target life end, the angle of inclination of the peripheral target surfaces can be adjusted to ensure that the film is formed as befits the various stages. If necessary, the supports can also be rotated (rotated and oscillated) within a certain range of angles of rotation to produce a film while allowing the angle of inclination to vacillate within a certain range.

The conditions should be experimentally checked in advance for the angle of inclination of each type of target that is used so as to adjust the angle of inclination of the peripheral targets to certain suitable angles under the prescribed conditions. In some cases, it is possible to form an optimal film by adjusting the angle during the formation of the film.

In a preferred sputtering device of the invention, the center axes of the supports serve as the rotating shafts of the supports, each rotating shaft being parallel to each other and to the surface on which the film is to be formed, and/or a plurality of supports is aligned in the direction in which the substrate holder or tray is moved in and out. Such a target-positioning mechanism will have a simpler structure.

The sputtering device of the present invention should also be provided with a distance-adjusting mechanism for adjusting the distance between the surface on which the film is to be formed and the sputtering surfaces of the targets mounted on the target-mounting surfaces, and/or the distance between the central axes of the various supports.

This will allow films of more uniform thickness to be formed according to the film-forming conditions. The conditions for such distance relationships should be experimentally checked in advance for each type of target so as to allow the distance to be set to a certain suitable distance under the prescribed conditions. In some cases, it is possible to form an optimal film by adjusting the distance during the formation of the film.

Each support of the sputtering device of the present invention should preferably be provided with a shield (also referred to as adhesion-preventing jig) in the sputtering chamber so as to encompass the support along a portion of the periphery of the support but not encompass the target facing the substrate when the film is formed. In this case, a shield-driving mechanism should be provided for driving the shield in conjunction with or independently of the supports.

Such a shield can be provided to align the targets into position so as to ensure that the sputtering surface of the target to be sputtered faces the substrate during the formation of the film, and also to protect targets that are not being used in the sputtering from scattered particles or sputter atoms produced during the sputtering process. Not only does this shorten the time needed for cleaning, but it also reduces the number of cleanings.

The sputtering device of the present invention may be a double-sided film-forming type of device. The cross section shape of the supports may be any one selected from polygonal shapes such as triangular, tetragonal, pentagonal or other polygonal more than pentagonal shapes, according to the number of targets that are used in the same sputtering chamber and that are mounted on a single support. Doing this will allow different types of targets to be mounted, in the maximum number corresponding to the number of sides (surfaces) of the support, on each support, and will thus allow the number of films corresponding to that number, and more films in the case of Ti films, TiN films obtained by reactive sputtering, or the like, to be built up on a substrate.

The substrate on which the film is formed by the sputtering device of the present invention should be a glass substrate, and such a glass substrate should preferably be larger than a semiconductor silicon wafer.

BRIEF DESCRIPTION OF THE DRAWINGS

The foregoing and other objects, features and advantages of the present invention will be better understood from following description taken in connection with accompanying drawings, in which.

DESCRIPTION OF THE PREFERRED EMBODIMENTS

Preferred embodiments of the sputtering device in the present invention are described below with reference to the figures, but the shape, size, and lay-out of the various structural components in the figures are merely given schematically to facilitate an understanding of the invention. Although preferred structural examples of the invention are described below, the invention is in no way limited to these preferred examples, and is capable of many variations and modifications within the scope of the invention.

Figure 1:
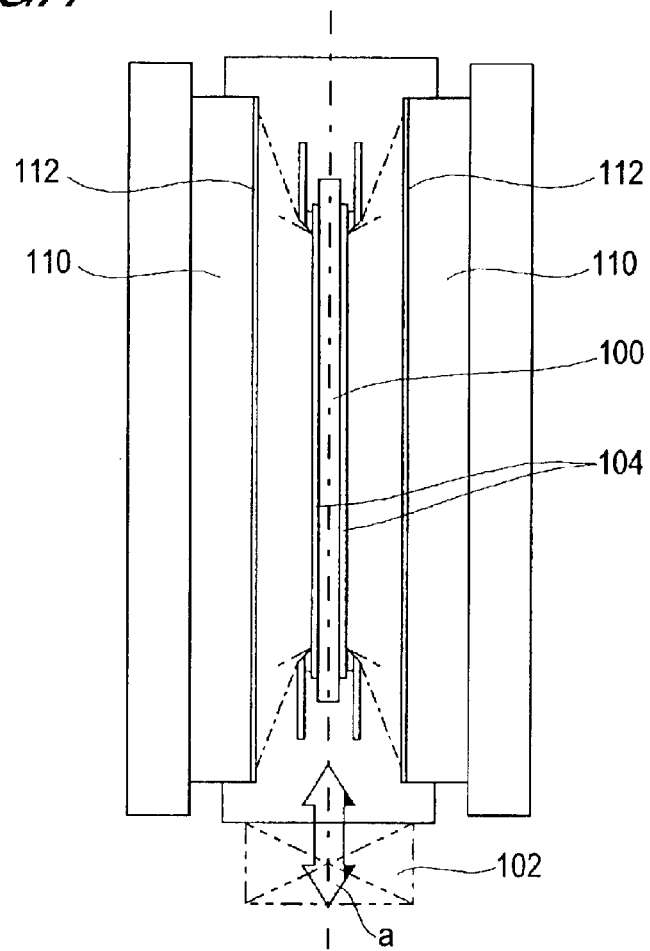
FIG. 1 is a schematic plan of the main components, illustrating a conventional sputtering device.
Figure 2:
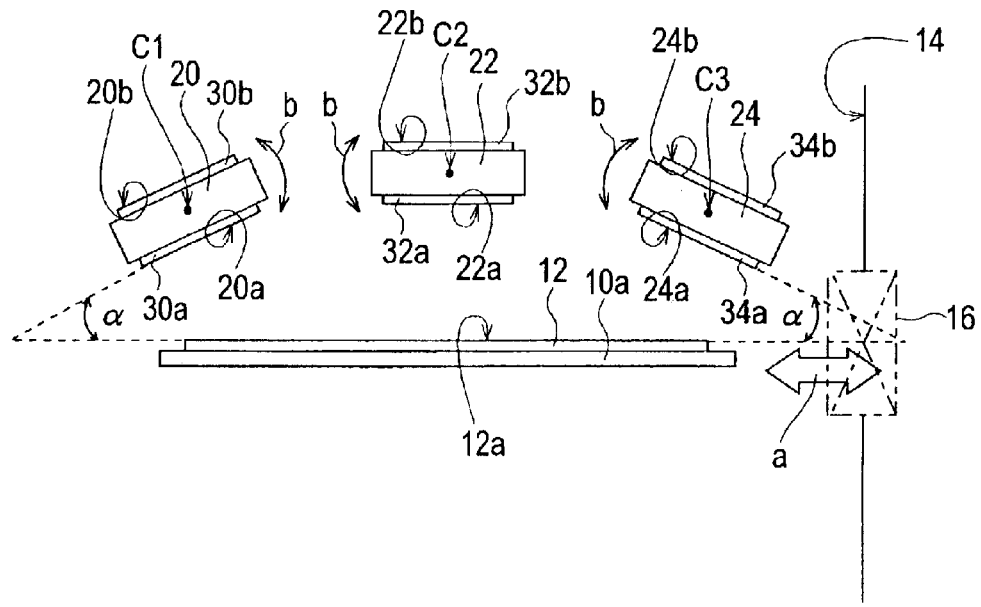
FIG. 2 is a schematic plan of the main components, illustrating the sputtering device of the present invention, and shows an example of a structure for simultaneous film formation on a substrate with the use of three targets.

FIG. 2 is a schematic plan primarily of the positional relationship between the substrate, supports, and target-mounting surfaces (and, hence, targets), which are major structural elements in the sputtering chamber of the sputtering device in the present invention. The targets mounted on the target-mounting surfaces are not shown in FIG. 2. In the structural example in FIG. 2, a substrate such as a glass substrate 12 is mounted on a substrate holder 10a. The substrate 12 is held on the substrate holder 10a perpendicular to the surface of the paper on which the figure is shown. The surface 12a of the substrate on which the film is to be formed is usually a flat surface.

The substrate is in the form of a rectangular, flat, parallel plane. The substrate holder 10a is moved and positioned, with the substrate 12 positioned thereon, through a gate valve 16 into the sputtering chamber 14 in the direction indicated by arrow a.

A plurality, three in this example, of supports 20, 22, and 24 for supporting the targets are disposed facing the surface 12a of the substrate on which the film is to be formed. In this structural example, the supports are supports with a tetragonal cross section shape, such as a rectangle in which the opposite surfaces are flat, parallel planes, the cross section thus being rectangular in the example. The supports 20, 22, and 24 are the same shape and size as each other, and are sequentially aligned in the direction in which the substrate holder moves in and out. The supports 20, 22, and 24 rotate (turn) about their central axes, which serve as their rotating shafts, and are formed in such a way as to be stopped at a suitable rotating location and be positioned at the stopped location.

The target-mounting surfaces are formed by the surfaces 20a, 22a, and 24a on the side of the supports 20, 22, and 24 facing the surface 12a on which the film is to be formed, and by the opposite surfaces 20b, 22b, and 24b on the other side. In this case, cathodes 30a, 30b, 32a, 32b, and 34a and 34b are individually provided on the surfaces themselves of the supports 20, 22, and 24, and the outside surfaces of the cathodes serve as target-mounting surfaces 20a, 22a, 24a, 20b, 22b, and 24b. In this structural example, the supports and cathodes are separate elements.

The centers of the rectangular cross section of supports 20, 22, and 24 are the central axes, that is, the rotating shafts C1, C2, and C3 in this structural example. These rotating shafts C1, C2, and C3 are parallel to the surface on which the film is to be formed, and are parallel to each other. The supports 20, 22, and 24 can be rotated back and forth in both directions, as shown by arrow b, around the rotating shafts C1, C2, and C3.

The rotating shaft C2 of the center support 22 is aligned with the center of the substrate 12, and the rotating shafts C1 and C3 of the peripheral supports 20 and 24 are positioned equidistantly from the rotating shaft C2. The rotating shafts C1 and C3 are also positioned equidistantly from the surface on which the film is formed, that is, the substrate surface 12a, and are also closer to the substrate surface 12a than is the center rotating shaft C2. At any rate, the targets are positioned in the positional relationship, vis-à-vis the film-forming surface and each other, that is best for forming the film.

The corresponding targets are mounted on each target-mounting surface. Among these targets, those targets which are mounted on cathodes 30a, 32a, and 34a are the same kinds of targets. The targets mounted on the other cathodes 30b, 32b, and 34b are different from the above targets and are the same as each other.

The center support 22 is positioned in such a way that the target-mounting surfaces 22a and 22b, that is, the sputtering surfaces of the targets mounted on the target-mounting surfaces, are parallel to the surface 12a on which the film is to be formed. Similarly, the target-mounting surfaces 20a, 20b and 24a, 24b of the peripheral supports 20 and 24 on either side of the center support, that is, the sputtering surfaces of the targets mounted on the target-mounting surfaces, are positioned so as to face the surface 12a on which the film is to be formed.

In this case, for example, the angles of intersection between the extension line of the surface 12a on which the film is to be formed and the extension lines of the target-mounting surfaces 20a and 24a of peripheral supports 20 and 24 are $\alpha$ (angle) equivalent to each other ($0° < \alpha < 90°$). Thus, the peripheral target-mounting surfaces 30a, 30b and 34a, 34b are inclined toward the center target-mounting surface in such a way that the sides which are further away from the center target-mounting surfaces 32a and 32b are closer to the film-forming surface 12a. As a result, the surface on which the film is to be formed and the sputtering surface of the peripheral targets are inclined (intersect) at an angle $\alpha$.

Described below are the aforementioned target-position mechanism for controlling the rotation of the supports and the distance-adjusting mechanism for controlling the distance between the supports and the surface on which the film is to be formed as well as the distance between the supports.

Figure 3:
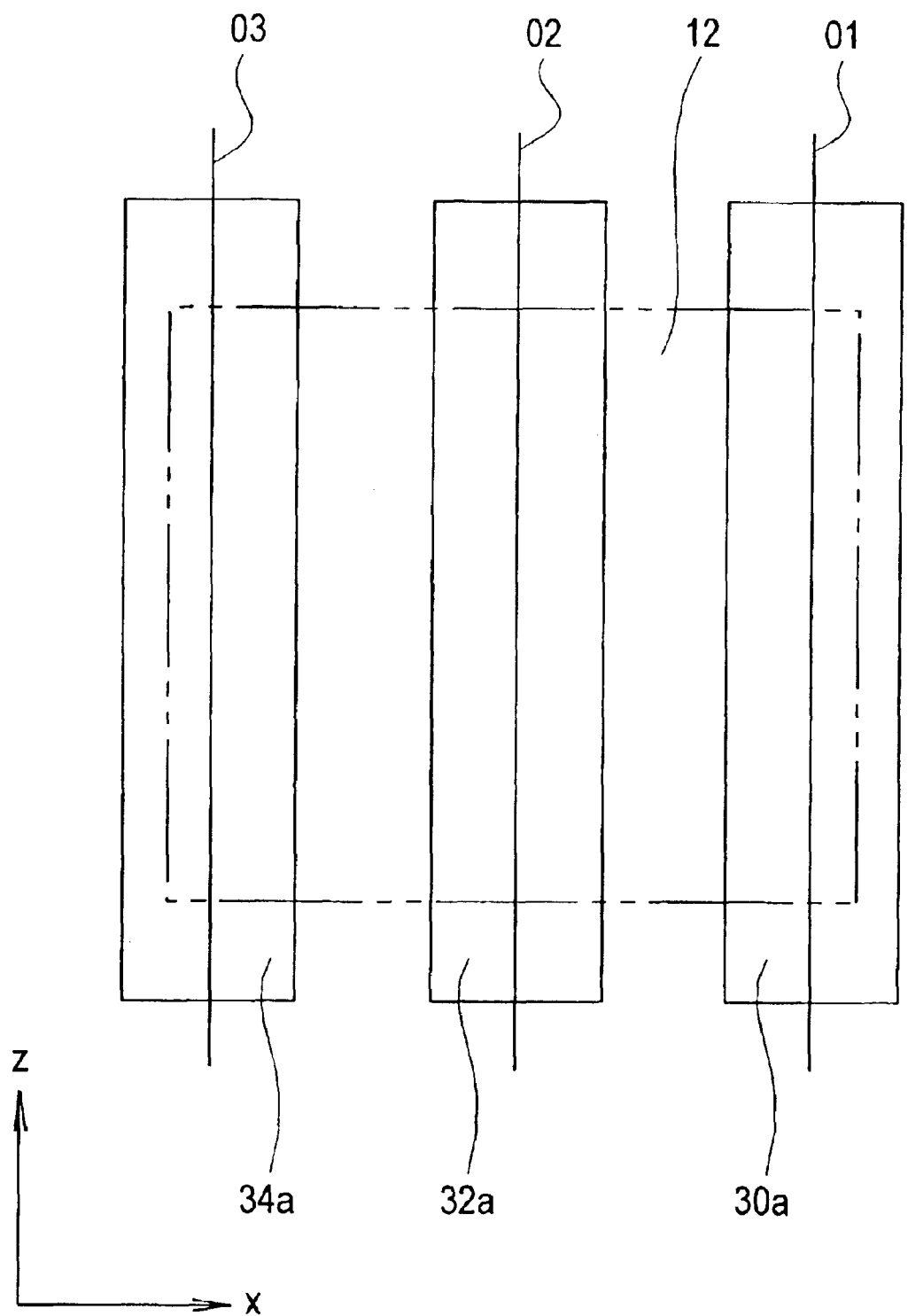
FIG. 3 is a schematic illustration of the positional relationship between the cathodes and the substrate used in the sputtering device of the present invention.

FIG. 3 is a schematic for a structural example in which three supports are employed, and illustrates the positional relationship between the glass substrate 12 and the cathodes 30a, 32a, and 34a provided on the supports 20, 22, and 24. The cathodes 30a, 32a, and 34a have rectangular block shapes. The long side of the substrate 12 is in the feed direction (direction x), and the short side is in the direction in which the substrate stands (vertical direction z), which is perpendicular to the above direction. The central axes 01, 02, and 03 of the cathodes are positioned so that they are parallel to each other and are parallel to the short side of the substrate 12. The central axis 02 of the central cathode 32a should be aligned with the center of the substrate 12.

In the structural example illustrated in FIG. 3, viewing the substrate side planarly from the cathode side, the cathodes 30a and 34a facing the periphery of the substrate are positioned such that the part of the edge on the side apart from the center cathode 32a, that is, the part of the widthwise area in the x direction, is off-set from the substrate 12. The position of the cathodes relative to the substrate is determined by the positioning of the supports. Their relative position should be determined in such a way that a film of suitable shape is produced according to the type or size of the mounted target, or other optional desirable conditions. Accordingly, when viewing the substrate side planarly from the cathode side, the widthwise region of the cathodes may be disposed so as to be within the substrate surface.

Naturally, the size and shape of the cathodes, and the number simultaneously facing the substrate, can be determined as desired according to the intended design.

In the aforementioned structural example, unused targets that inevitably remain may be cleaned while a target that is attached to a support is selected to form a film. A target can thus be pre-cleaned during the formation of a film, so as to reduce the normal cleaning of the target that is formed, thereby cutting down on the overall processing time or reducing the number of cleanings.

Figure 4:
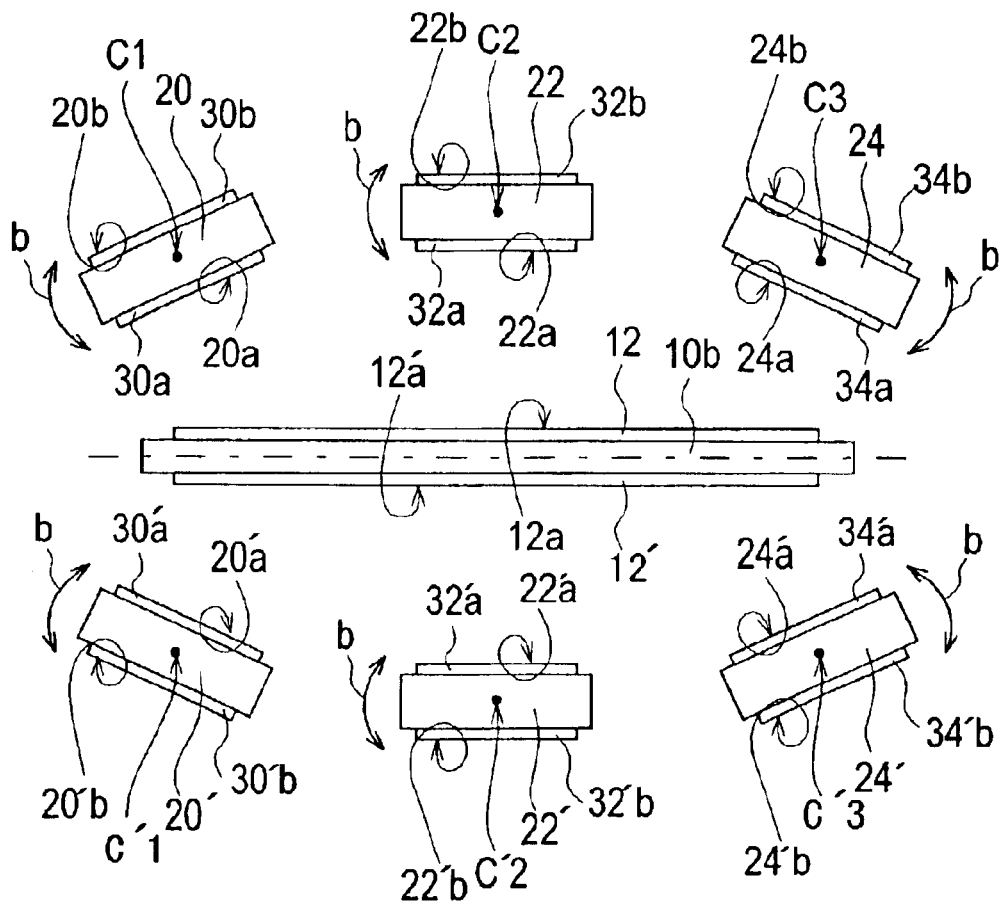
FIG. 4 is a schematic plan of the main components, illustrating the structure in another example of the sputtering device of the present invention, and shows an example of a structure involving the application of the present invention in a double-sided film-forming type of device.

FIG. 4 is a plan similar to FIG. 2, schematically illustrating an example of a structure when the invention is applied to a double-sided film-forming type of device. This case is of a structural example in which substrates such as glass substrates 12 and 12' are mounted on both sides of a tray 10b inside the sputtering chamber to simultaneously form films on the film forming sides 12 and 12' of both the substrates. In this structural example, in addition to the supports shown in FIG. 2, other supports and the like are symmetrically provided for the tray 10b on the other side of the tray 10b. A prime is attached to the symbols for the structural elements shown in FIG. 2 to indicate these new symmetrically provided supports and other necessary structural elements. These additional supports and the like have the same structure and action (or function) as the supports and the like described in FIG. 2, and thus will not be described in detail. In this structural example, the supports 20, 22, 24 and 20', 22', 24' are rotatable back and forth in either direction, as indicated by arrow b, around the center axes C1, C2, C3 and C'1, C'2, and C'3. The targets are not shown in FIG. 4.

In FIG. 4, cathodes 30'a, 30'b, 32'a, 32'b, 34'a, and 34'b correspond to cathodes 30a, 30b, 32a, 32b, 34a, and 34b, respectively, as shown in FIG. 4 and described with respect to FIG. 2. Target-mounting surfaces 20'a, 20'b, 22'a, 22'b, 24'a, and 24'b correspond to target-mounting surfaces 20a, 20b, 22a, 22b, 24a, and 24b, respectively, as shown in FIG. 4 and described with respect to FIG. 2. Film-forming surface 12'a corresponds to film-forming surface 12a as shown in FIG. 4 and described with respect to FIG. 2.

When constructed in this manner, films of a plurality of components can be continuously formed in sequence on two substrates in the same sputtering chamber. In such cases, when films are simultaneously formed on the one substrate 12 and the other substrate 12', the supports are rotated to select and position the targets suitable for film formation. This will allow films with components that are different from each other to be formed on the substrates.

In the structural examples illustrated in FIGS. 2 and 4, two types of targets can be mounted on a single support, thus allowing two kinds of films to be built up on the film-forming surface of a substrate in the same sputtering chamber. Films may also be formed by mounting only one substrate in double-sided film-forming types of devices.

Figure 5:
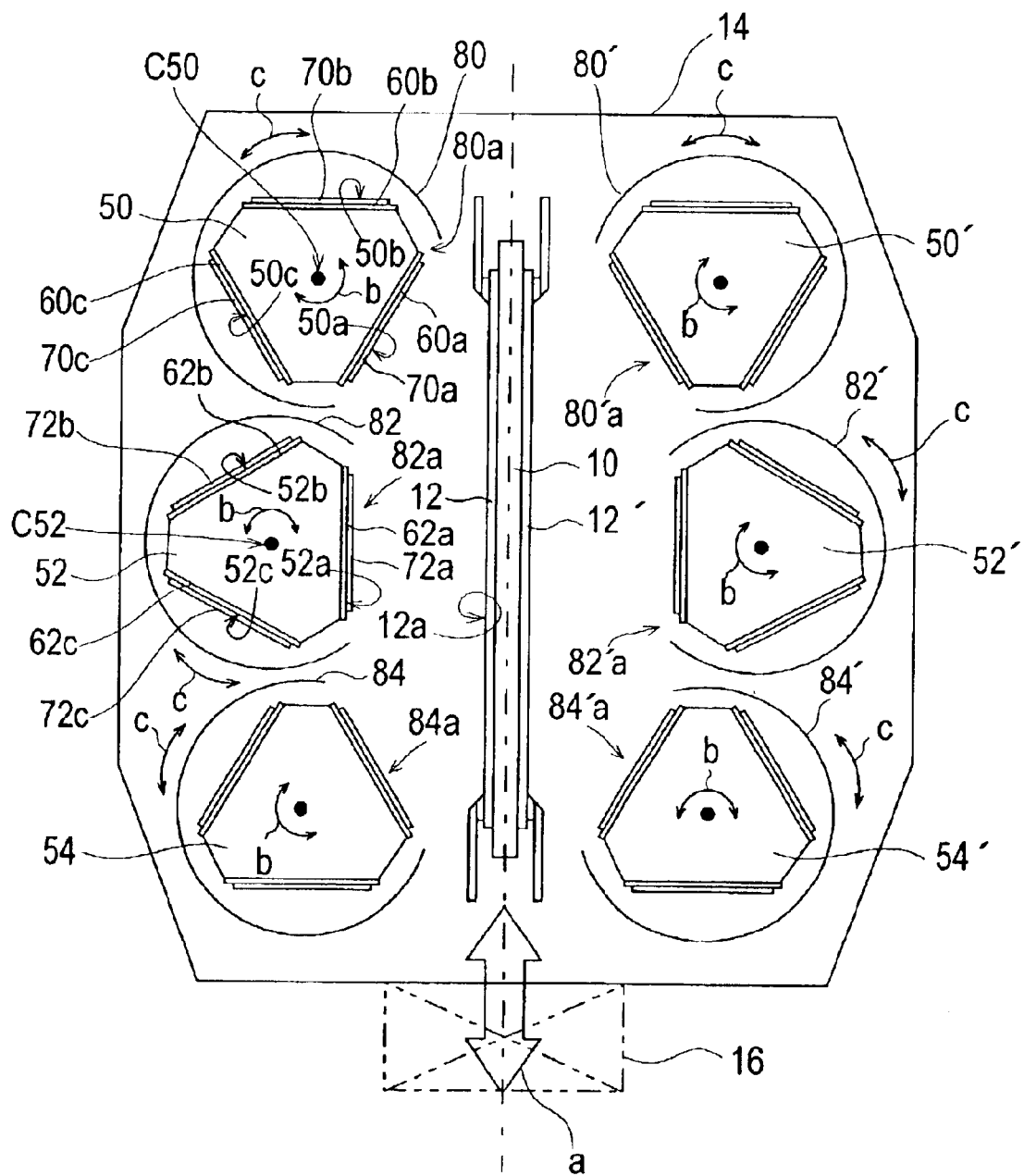
FIG. 5 is a schematic plan of the main components, illustrating the structure in still another example of the sputtering device of the present invention, and shows an example of a structure involving the application of the present invention in a double-sided film-forming type of device.

FIG. 5 is a schematic plan illustrating another structural example involving the application of the present invention to a double-sided film-forming type of device. This structural example is basically the same as that illustrated in FIG. 4, but differs in that one support is provided with three targets. This feature will thus be described in this structural example, but a description of the structural components that are the same as those of the structures in FIGS. 2 and 4 will be omitted to avoid redundancy.

In the structural example illustrated in FIG. 5, three supports having the same structure are provided on the both sides of the tray 10. Supports 50, 52, and 54 and 50', 52', and 54' correspond to supports 20, 22, 24 and 20', 22', and 24' illustrated in FIG. 4. The supports are roughly in the shape of hexagonal columns, but every other side is larger, to allow a cathode to be placed on those sides. Each support rotates (turns) back and forth, as shown by arrow c, about the central axes C50, C52, etc. serving as the rotating shafts, and can stop at suitable rotating positions so as to position the targets at those stop locations. The central axis of each support is parallel to the film-forming surface and to the other central axes in the same manner as the central axes of supports 20, 22, and 24 described earlier.

Of these six supports, the center and one peripheral support 50 and 52 will be described as an example, whereas the structure and action of the remaining supports will not be described in order to avoid redundancy, since they are the same as supports 50 and 52.

The rotating shafts of supports 50 and 52 are C50 and C52, and the cathodes provided on three sides of each support are 60a, 60b, 60c and 62a, 62b, and 62c. Targets 70a, 70b, 70c and 72a, 72b, and 72c are mounted on target-mounting surfaces 50a, 50b, 50c and 52a, 52b, and 52c of the cathodes. The three targets per support are different types of targets. The same types of targets are mounted in the same positional order between the supports. As a result, the same types of targets face the substrate at the same time.

In the structural example illustrated in FIG. 5, the supports are rotated to position the first targets that are the same type as each other relative to the substrate for film formation. To form the second film, the supports are rotated to position the second targets, which are different from the first targets but are the same as each other, so as to face the substrate, and the film is formed. To form the third film, the supports are rotated to position the third targets, which are different from the first and second targets but are the same as each other, so as to face the substrate, and the film is formed. It is thus possible to form a film having three different components on a substrate 12 in the same sputtering chamber.

In the structural example illustrated in FIG. 5, the sputtering surface of the target facing the film-forming surface of the substrate, and hence the target-mounting surface of the supports, are parallel to the film-forming surface 12a during film formation in the case of the center support 52, in the same manner as described in FIG. 2, but are inclined at an angle α relative to the film-forming surface 12a in the case of the peripheral support 50. However, the sputtering surfaces of all the targets facing the substrate during film formation may be parallel to the substrate surface.

In the structural example shown in FIG. 5, the supports are provided with shields (also referred to as adhesion-preventing jigs) 80, 82, 84, 80', 82', and 84' to cover the supports. These shields, that is, adhesion-preventing jigs, are provided so as to substantially cover the entire length of the cathode or target in the vertical direction along the direction of the central axes of the supports. The shields 80, 82, 84, 80', 82', and 84' are provided so as to encompass the periphery of the supports, without impeding the rotation of the supports. The shields are also formed in such a way that the targets 70a and 72a facing the film-forming surface of the substrate are exposed past the shields 80 and 82 during film formation, that is, the targets being sputtered during film formation are not encompassed.

In the structural example illustrated in FIG. 5, the cross section of the shields is C-shaped. The targets needed during film formation are thus positioned at the openings 80a, 82a, 84a, 80'a, 82'a, and 8'a in the vertical portion of the C-shaped shields 80, 82, 84, 80', 82', and 84'.

Providing the shields in this manner allows undesirable particles or sputtering atoms scattered during the formation of the film to be prevented from adhering to the surface of the cathodes or targets which are retracted without being used during film formation.

The shields can also be driven in conjunction with the supports by a shield-driving mechanism described below, and can also be detached from the supports. The option of being driven in conjunction with the supports or of being detached from the supports can be selected automatically or by external command by means of the shield-driving mechanism. The shields are driven in conjunction with the supports in cases where the supports are to be rotated and oscillated within a certain range of angles of rotation, such as when the angle of intersection α (angle of inclination) between the sputtering surface of the targets and the film-forming surface of the substrate is adjusted or when the angle of incline is periodically changed within a certain range of angles of inclination (α). Accordingly, the shields can be detached from the supports to allow the supports to be rotated in order to select the targets used for sputtering during the formation of the film, and it is thus possible to stop the shields in such cases.

A cleaning device can also be provided on the inside of the shields to pre-clean each support at a time without affecting the other supports and substrate. Such a cleaning device is described below.

Figure 6A:
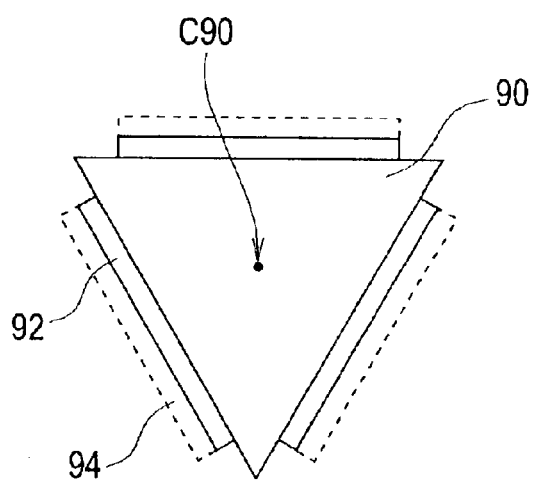
FIGS. 6(A) and 6(B) are schematic plans illustrating another example of the structure of the supports used in the sputtering device of the present invention.

FIGS. 6(A) and (B) are schematic plans illustrating variant examples of the supports. In the structural example depicted in FIG. 6(A), the support 90 is in the form of a triangular column, and cathodes 92 are formed on the three sides, with targets 94 individually secured on the target-mounting surfaces thereof. The support 90 is rotatable around the central axis (rotating shaft) C90.

Figure 6B:
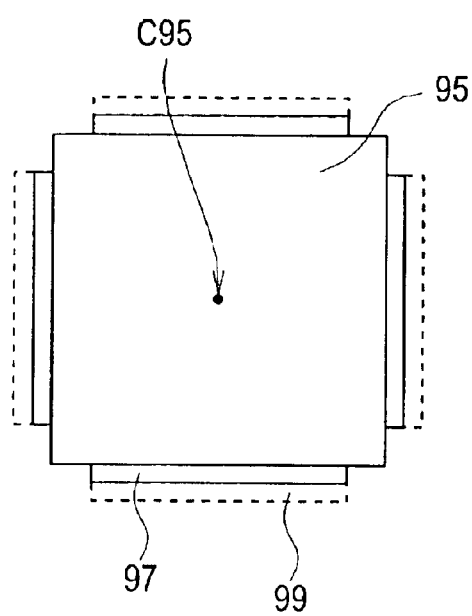

In the structural example depicted in FIG. 6(B), the support 95 is in the form of a rectangular column, and cathodes 97 are formed on the four sides, with targets 99 individually secured on the target-mounting surfaces thereof. The support 95 is rotatable around the central axis (rotating shaft) C95.

These supports 90 and 95 can be used instead of the supports previously illustrated in FIGS. 2, 4, and 5.

Umbrella-shaped supports can also be used in addition to the aforementioned structural examples of supports.

The number and lay-out of the supports provided in the sputtering chamber can be any desired number or lay-out. In the structural examples depicted in FIGS. 2, 4, and 5 above, for example, the examples are of three supports disposed on one side of a substrate, but four or more may be used. The illustrated lay-out is a single row, but the lay-out may also be staggered or circular.

A target-positioning mechanism and distance-adjusting mechanism are briefly described below with reference to FIGS. 7 and 8.

Figure 7:
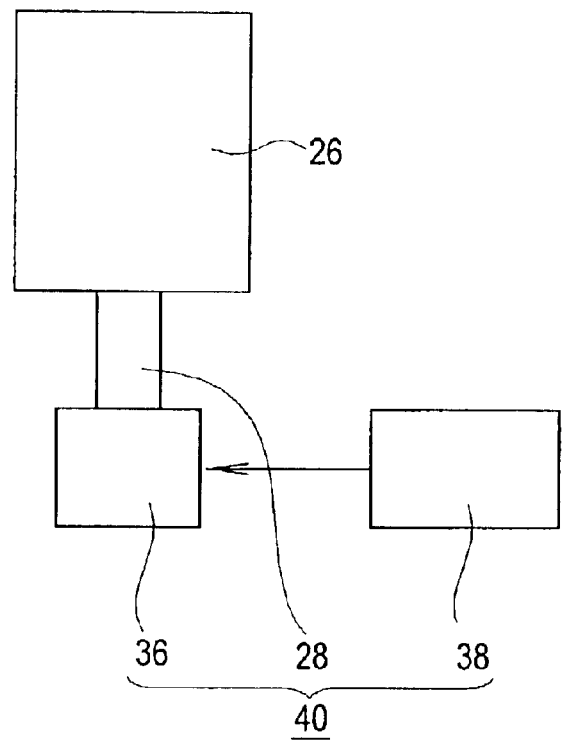
FIG. 7 is an illustration of the target-positioning mechanism used in the sputtering device of the present invention.

FIG. 7 is a schematic illustration of a target-positioning mechanism. In FIG. 7, 26 is a support, 28 is the rotating shaft of the support, and 36 is a rotating mechanism for rotatably driving the rotating shaft, such as a motor or power transmission device. 38 is a control component for driving and controlling the rotating mechanism. The rotating shaft 28, rotating mechanism 36, and control component 38 form the target-positioning mechanism 40. The rotating mechanism 36 and control component 38 of the target-positioning device 40 can be readily constructed using any suitable conventional well-known means. In the present invention, the support 26 should be able to be rotated and driven back and forth in a 360 degree angle range, and stopped at a suitable rotating position to position the support. The support 26 can be alternately rotated back and forth as needed within the prescribed range of rotating angles, that is, rotated and oscillated.

In order to control the rotation, stopping, and oscillation or the like, a program should be pre-installed in the control component 38 to allow the desired functions such as rotation, rotational oscillation, or stopping to be controlled by external command or automatically without any commands according to the program.

Unlike this structural example, the support 26 itself can be mounted on a rotating plate (not shown) that rotates while pivoting about the central axis, instead of connecting the rotating mechanism directly to the rotating shaft 28, and the rotating plate can be rotated by a rotating mechanism, but the choice of which means to use is merely a matter of design and does not constitute an essential matter of the invention.

The target-positioning mechanism 40 can be provided inside or outside the sputtering chamber, the choice being merely a matter of design.

Figure 8:
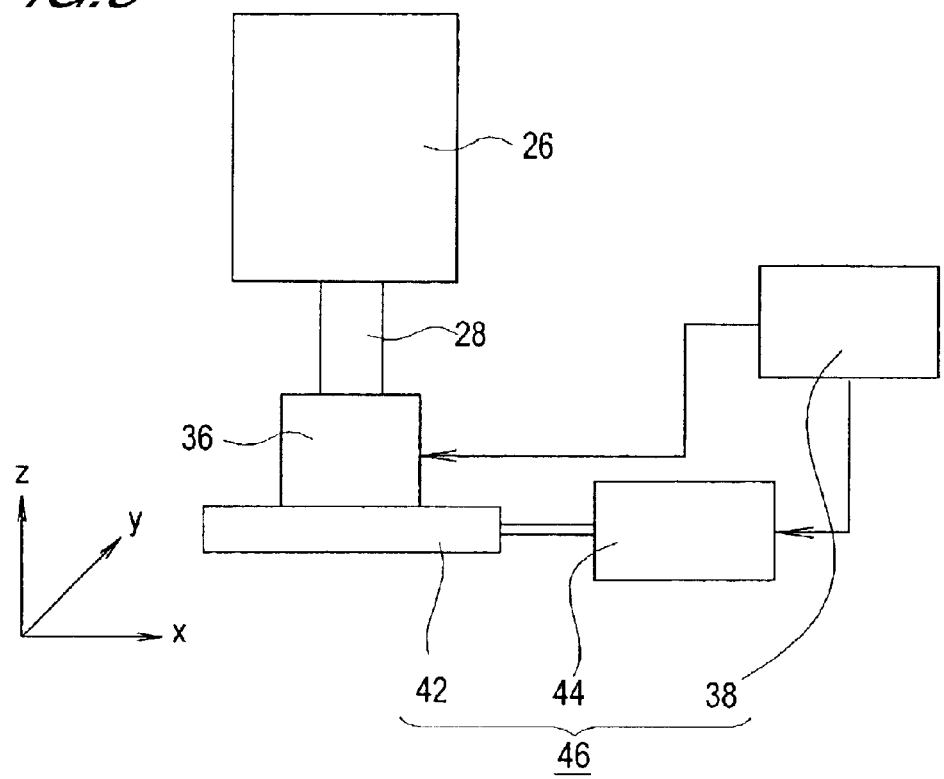
FIG. 8 illustrates the distance-adjusting mechanism used in the sputtering device of the present invention.

FIG. 8 is a schematic illustration of a distance-adjusting mechanism. In FIG. 8, 42 is a stage on which the support 26 and aforementioned rotating mechanism 36 are mounted and supported. The stage 42 can be constructed using any suitable conventionally well-known means. In this structural example, a two-way or three-way drive mechanism 44 and a control component 38 for controlling the drive of the drive mechanism 44 are used to control the drive of the stage 42. Accordingly, the drive-adjusting mechanism 46 is composed of a stage 42, drive mechanism 44, and control component 38. The drive mechanism 44 can drive the stage 42 in two horizontal directions x and y, and in some cases the vertical direction, that is, direction z, according to the program of the control component 38.

The distance-adjusting mechanism 46 can be provided inside or outside the sputtering chamber, the choice being merely a matter of design.

The data and means necessary for controlling and driving the aforementioned target-positioning mechanism 40 and distance-adjusting mechanism 46 may be pre-programmed based on data determined by experiment, and pre-stored in the control component 38.

Such necessary data can include, for example, the number of supports, the number of targets attached per support, the size of the substrate, the size and type of the targets, the adjustable distance range between the centers of the supports, the adjustable distance range between the substrate surface and the centers of the supports, the adjustable angle of inclination range between the peripheral supports and the substrate surface, and other suitable data. Such data is obtained in the form of groups of data giving the optimal film as designed for each type of target by means of prior actual measurement. The various control and drive functions described above can be managed by means of programs prepared on the basis of such data.

In the aforementioned structural example, the distance-adjusting mechanism 46 comprised a drive mechanism 36 mounted on a stage 42, but any other structure that allows the supports to be moved in directions x, y, and z can also be used.

The manner in which the drive is controlled is not an essential matter of the present invention, and thus will not be described beyond what has been described above.

In the structural examples previously illustrated with reference to FIGS. 2, 4, and 5, it is desirable to provide a cleaning device for cleaning the targets which are not used in the sputtering process during the formation of the film. The cleaning device is provided with at least a gas supply component used in the cleaning and a dedicated DC or high-frequency power source for each cathode on which targets are mounted. If necessary, shielding means may be provided to prevent undesirable sputtering atoms, gas, or scattered particles from mingling between the region on the cleaning side and the region on the film-forming side in the sputtering chamber. Such cleaning devices and shielding means can be any suitable structure according to the intended design.

Figure 9:
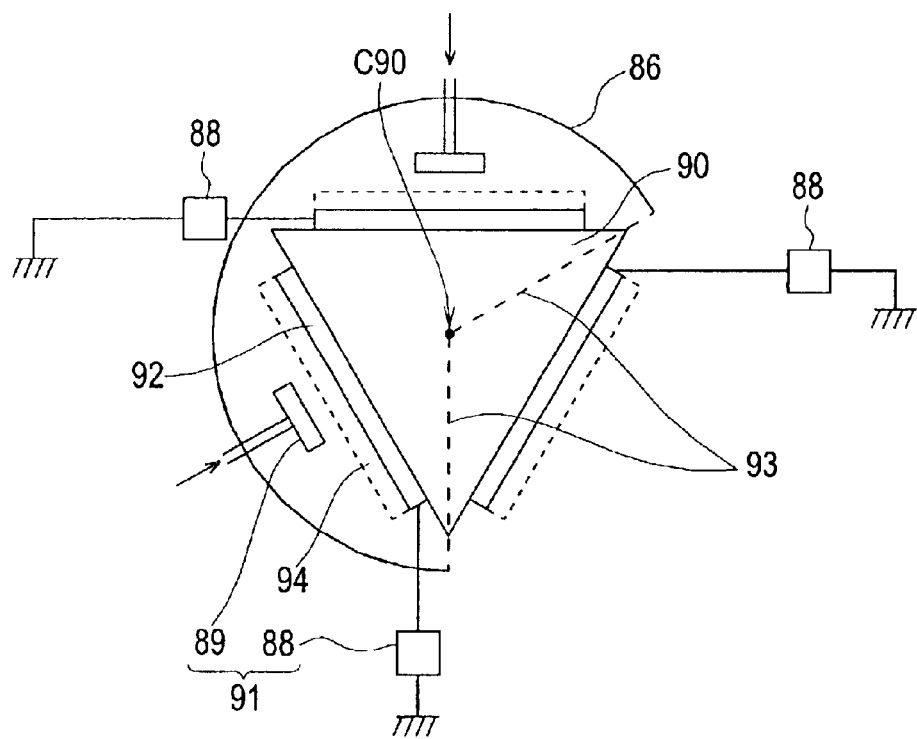
FIG. 9 is a schematic illustrating the cleaning device which is a major component of the sputtering device in the present invention.

FIG. 9 is a schematic illustration of a structural example of a cleaning device. In this example, the support 90 illustrated in FIG. 6(A) is provided with a shield 86. Each cathode 92 is provided with a DC or high-frequency power source 88 capable of individually supplying power. A gas feed component 89 is provided, which is capable of allowing the gas needed for cleaning to be introduced from the outside and blown into the space between the shield 86 and unused targets mounted on the support 90. Shielding means 93 can be provided so as to create a generally air-tight space between the shield 86 and support 90 as shown by dashed line in the figure.

The DC or high-frequency power source 88 can be connected to each cathode 92 through the interior of the rotating shaft of the support 90. Gas feed components 89 may be connected to each other or provided separately. Gas feed components 89 may also be provided integrally joined to the shields 86 or separately from the shields 86. The cleaning device 91 may be automatically controlled in conjunction with the film-forming process, or the cleaning device 91 may be independent from the film-forming process and controlled manually by commands, either option being a matter of design.

Figure 10:
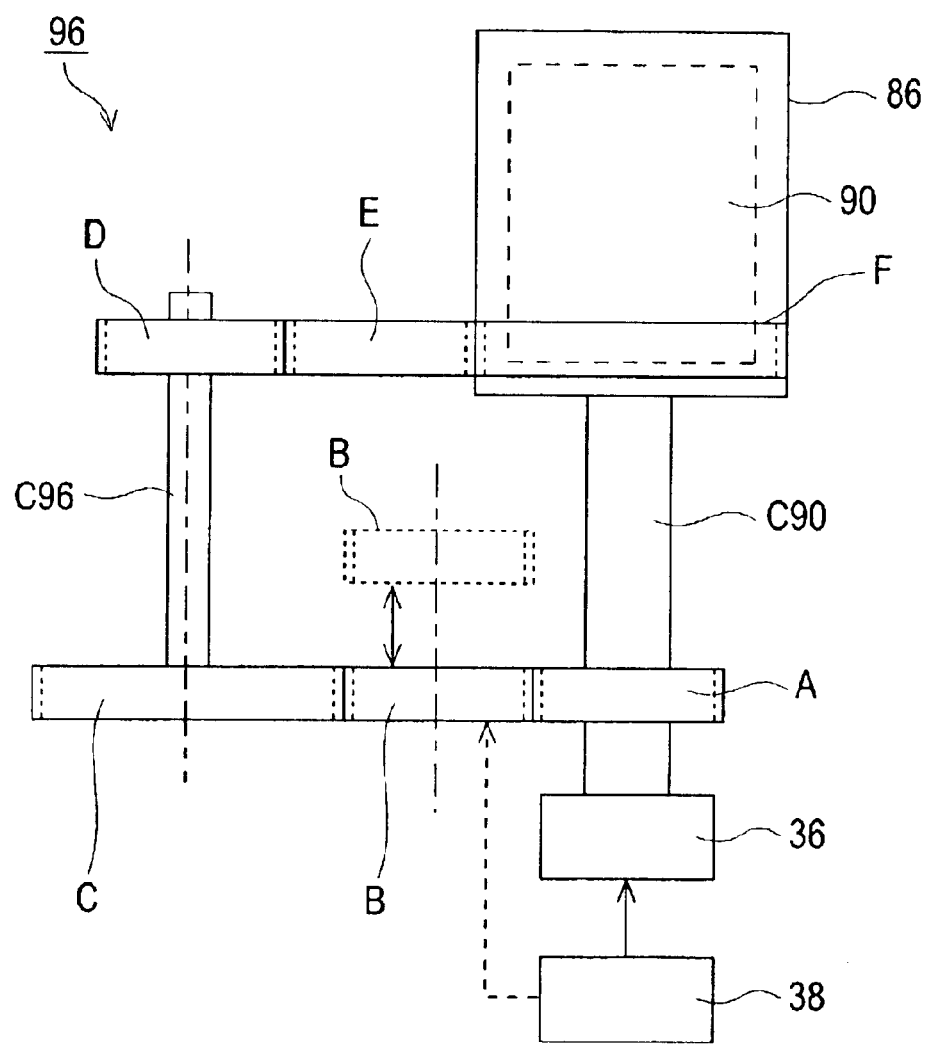
FIG. 10 is a schematic illustrating the shield-driving mechanism which is a major component of the sputtering device in the present invention.

FIG. 10 is a schematic of an example of a shield-driving mechanism. In this structural example, the support 90 illustrated in FIG. 6(A) is provided with a shield 86. The shield-driving mechanism can be constructed with the optimal combination of gears, racks, belts, or other power transmission means for the power transmission mechanism based on a consideration of the operating properties and the environment in which the driving mechanism is situated.

The shield-driving mechanism 96 in the figure is an example of a combination of a gear and a rotating shaft. The rotating shaft C90 of the support 90 is driven by a rotating mechanism 36 as described in FIG. 7. A gear A is attached to the rotating shaft C90. A gear B joins, that is, meshes with the gear A in such a way as to be detachable from the gear A, and a gear C is joined to the gear B. The gear C is provided with a rotating shaft C96, and the rotating shaft is provided with another gear D. A gear E is joined to the gear D, and a gear F provided on the outer wall of the shield 86 is joined to the gear E.

The shield 86 is naturally provided with a rotation support (not shown in figure) for supporting the rotation of the shield. The relationship between the number of teeth in the gears is set so that the rotation of the shield 86 and support 90 can be synchronized. The number of teeth in the gears that are used is set so that the direction in which the rotating shaft C90 rotates is aligned with the direction in which the shield 86 rotates.

All the gears A, B, C, D, E, and F mesh in sequence in order to ensure the interlocked rotation of the shield 86 and support 90. However, when the shield 86 is disengaged from the rotation of the support 90 and stopped, the gear B should be disengaged from the flanking gears A and C (shown by dashed line in FIG. 10). This engagement and disengagement can be automated by commands from the control component 38.

As described previously, the structure of the shield-driving mechanism 96 is not limited to the structural example depicted in FIG. 10.

Examples of the use of glass substrates were described in the aforementioned embodiments, but silicon substrates for semiconductors and other substrates can be used instead of glass substrates in the present invention, giving the same effects of the invention as when glass substrates are used.

Characteristic components of the invention were described in the aforementioned sputtering device, but the sputtering device will naturally be equipped with the usual necessary structural elements, such as a vacuum exhaust system, sputtering gas feed system, conveyor system, loading/unloading chamber, and other processing chambers. However, since such common structural elements are not essential matters of the present invention, they have not been depicted or described.

It will be evident from the foregoing description that a plurality of rotatable supports is provided in the same sputtering chamber in the structure of the sputtering device of the present invention, and that each support is provided with different targets in the number, at most, suited to the number of films built up in sequence on the film-forming surface of the same substrate. Targets of the same type are selected from the supports by rotating the supports.

Thus, in the sputtering device of the present invention, a plurality of films can be built up in sequence on the same substrate in the same sputtering chamber. A merit of the invention is thus that there is no need for different sputtering chambers for each film that is formed, as was the case in conventional sputtering devices. The inherent surface area of the device as a whole can thus be reduced, allowing space in the device to be conserved, with no need to move the substrate in and out of the sputtering chamber every time a film is formed, so that the time needed to process the substrate in order to form a film is dramatically reduced, resulting in higher throughput than in the past.

Furthermore, in the sputtering device of the present invention, the targets with the components needed to form a film in the single sputtering chamber are divided across a plurality of targets, which are disposed facing the substrate. Because it is thus possible to use smaller sized targets which involve lower manufacturing costs, and because extremely detailed film-manufacturing conditions can be adjusted for local areas on the substrate surface, films of more uniform thickness can be formed over the entire surface of the substrate, even large substrates. Thus, in this respect as well, the sputtering device of the present invention is capable of higher throughput than in the past.

What is claimed is:

1. A sputtering device for forming a film by means of simultaneous sputtering of a plurality of targets, comprising:
    a sputtering chamber;
    a plurality of target supports which are placed opposite a film-forming surface where a film is to be formed of a substrate mounted on a substrate holder inside said sputtering chamber, respectively and which are rotatable around their central axis, respectively;
    a plurality of cathodes having target-mounting surfaces, respectively, and provided apart from each other on each of said supports; and
    a target positioning mechanism capable of rotating said supports to adjust said targets mounted on each of said target-mounting surfaces of said supports into film-forming position where said targets face said film-forming surface; and
    wherein a cross section shape of each of said supports is any one shape selected from the group of shapes consisting of triangular, tetragonal, pentagonal and polygon with more than five sides.

2. A sputtering device according to claim 1, wherein a center target-mounting surface facing a center area of said film-forming surface of said substrate is parallel to said film-forming surface, and peripheral target-mounting surfaces facing peripheral areas of said film-forming surface, respectively, are inclined relative to said center target-mounting surface in such a way that areas of said peripheral target-mounting surfaces which are further away from said center target-mounting surface are closer to said film-forming surface.

3. A sputtering device according to claim 2, wherein said target-positioning mechanism comprising a first driving device for rotating, during the film production, said supports opposite to a peripheral area of said substrate to adjust an angle of incline of said peripheral target-mounting surfaces of said supports relative to said film-forming surface.

4. A sputtering device according to claim 3, wherein center axes of said supports serve as rotating shafts of said supports, each rotating shaft being parallel to each other and parallel to said film-forming surface.

5. A sputtering device according to claim 3, wherein said plurality of supports are aligned in the direction in which said substrate holder is moved in and out.

6. A sputtering device according to claim 3, further comprising a distance-adjusting mechanism for adjusting the distance between said film-forming surface and a sputtering surface of said target mounted on said target-mounting surface.

7. A sputtering device according to claim 3, further comprising a distance-adjusting mechanism for adjusting the distance between center axes of said supports.

8. A sputtering device according to claim 3, further comprising a cleaning device for cleaning the targets mounted on target-mounting surfaces, not facing said substrate, on said supports.

9. A sputtering device according to claim 2, wherein said target-positioning mechanism comprises a second driving device for causing, during the film production, said supports opposite to a peripheral area of said substrate to rotate and oscillate alternately forward and backward within a certain range of angles.

10. A sputtering device according to claim 1, wherein the center axes of said supports serve as rotating shafts of said supports, each rotating shaft being parallel to each other and parallel to said film-forming surface.

11. A sputtering device according to claim 1, wherein said plurality of supports are aligned in the direction in which said substrate holder is moved in and out.

12. A sputtering device according to claim 1, further comprising a distance-adjusting mechanism for adjusting the distance between said film-forming surface and a sputtering surface of said target mounted on said target-mounting surface.

13. A sputtering device according to claim 1, further comprising a distance-adjusting mechanism for adjusting the distance between said supports.

14. A sputtering device according to claim 1, further comprising a cleaning device for cleaning targets mounted on target-mounting surfaces, not facing said substrate, on said supports.

15. A sputtering device according to claim 1, wherein each support is provided with a shield in said sputtering chamber so as to encompass said support along a portion of the periphery of said support but not encompass the target facing said substrate when the film is formed.

16. A sputtering device according to claim 15, further comprising a shield-driving mechanism capable of driving said shields in conjunction with said supports.

17. A sputtering device according to claim 1, wherein said target-mounting surfaces on each of said supports are parallel to said film-forming surface of said substrate, and are parallel to each other.

18. A sputtering device for forming a film by means of a simultaneous sputtering of a plurality of targets, comprising:
    a sputtering chamber;
    a tray capable of being moved in and out of said sputtering chamber;
    a plurality of target supports which are placed opposite a film-forming surface where a film is to be formed of a substrate mounted on a substrate holder inside said sputtering chamber, respectively and which are rotatable around their central axis, a plurality of cathodes having target-mounting surfaces, respectively, and provided apart from each other on each of said supports; and
    a target positioning mechanism capable of rotating said supports to adjust said targets mounted on each of said target-mounting surfaces of said supports into film-forming position where said targets face said film-forming surface; an
    wherein a cross section shape of each of said supports is any one shape selected from the group of shapes consisting of triangular, tetragonal, pentagonal and polygon with more than five sides.

19. A sputtering device according to claim 18, wherein said sputtering device is a double-sided film-forming device in which a film is formed on each of substrates mounted respectively on both sides of said tray.

20. A sputtering device according to claim 18, wherein a center target-mounting surface facing a center area of said film-forming surface of said substrate is parallel to said film-forming surface, and peripheral target-mounting surfaces facing a periphery at areas of said film-forming surface, respectively, are inclined relative to said center target-mounting surface in such a way that areas of said peripheral target-mounting surfaces which are further away from said center target-mounting surfaces are closer to said film-forming surface.

21. A sputtering device according to claim 20, wherein said target-positioning mechanism comprises a first driving device for rotating, during the film production, said supports opposite to a peripheral area of said substrate to adjust an angle of incline of said peripheral target-mounting surfaces of said supports relative to said film-forming surface.

22. A sputtering device according to claim 21, wherein center axes of said supports serve as rotating shafts of said supports, each rotating shaft being parallel to each other and parallel to said film-forming surface.

23. A sputtering device according to claim 21, wherein said plurality of supports are aligned in the direction in which said tray is moved in and out.

24. A sputtering device according to claim 21, further comprising a distance-adjusting mechanism for adjusting the distance between said film-forming surface and a sputtering surface of said target mounted on said target-mounting surface.

25. A sputtering device according to claim 21, further comprising a distance-adjusting mechanism for adjusting the distance between center axes of said supports.

26. A sputtering device according to claim 21, further comprising a cleaning device for cleaning the targets mounted on target-mounting surfaces, not facing said substrate, on said supports.

27. A sputtering device according to claim 20, wherein said target-positioning mechanism comprises a second driving device for causing, during the film production, said supports opposite to a peripheral area of said substrate to rotate and oscillate alternately forward and backward within a certain range of angles.

28. A sputtering device according to claim 18, wherein a center axes of said supports serve as rotating shafts of said supports, each rotating shaft being parallel to each other and parallel to said film-forming surface.

29. A sputtering device according to claim 18, wherein said plurality of supports are aligned in the direction in which said tray is moved in and out.

30. A sputtering device according to claim 18, further comprising a distance-adjusting mechanism for adjusting the distance between said film-forming surface and a sputtering surface of said target mounted on said target-mounting surface.

31. A sputtering device according to claim 18, further comprising a distance-adjusting mechanism for adjusting the distance between said supports.

32. A sputtering device according to claim 18, further comprising a cleaning device for cleaning targets mounted on target-mounting surfaces, not facing said substrate, on said supports.

33. A sputtering device according to claim 18, wherein each support is provided with a shield in said sputtering chamber so as to encompass said support along a portion of the periphery of said support but not encompass the target facing said substrate when the film is formed.

34. A sputtering device according to claim 33, further comprising a shield-driving mechanism capable of driving said shields in conjunction with said supports.

35. A sputtering device according to claim 18, wherein said target-mounting surfaces on each of said supports are parallel to said film-forming surface of said substrate, and are parallel to each other.

* * * * *